United States Patent
Hata et al.

(10) Patent No.: US 8,633,103 B2
(45) Date of Patent: Jan. 21, 2014

(54) SEMICONDUCTOR DEVICE AND MANUFACTURING METHOD OF THE SAME

(75) Inventors: Hanae Hata, Yokohama (JP); Masato Nakamura, Hitachinaka (JP); Nobuhiro Kinoshita, Kodaira (JP); Jumpei Konno, Tachikawa (JP); Chiko Yorita, Fujisawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 32 days.

(21) Appl. No.: 12/814,472

(22) Filed: Jun. 13, 2010

(65) Prior Publication Data

US 2011/0012263 A1 Jan. 20, 2011

(30) Foreign Application Priority Data

Jul. 16, 2009 (JP) ................. 2009-167716

(51) Int. Cl.
*H01L 21/60* (2006.01)
*H01L 23/488* (2006.01)

(52) U.S. Cl.
USPC ............................ 438/614; 438/109; 438/615

(58) Field of Classification Search
USPC ......... 438/584, 612, 613, 614, 615, 106, 107, 438/118, 119; 257/E21.509, E21.51, 257/E21.514
See application file for complete search history.

(56) References Cited

U.S. PATENT DOCUMENTS

| | | | | |
|---|---|---|---|---|
| 5,038,996 A | * | 8/1991 | Wilcox et al. | 228/121 |
| 5,118,029 A | * | 6/1992 | Fuse et al. | 228/198 |
| 5,296,649 A | * | 3/1994 | Kosuga et al. | 174/250 |
| 6,474,531 B2 | * | 11/2002 | Ozawa | 228/103 |
| 6,744,142 B2 | | 6/2004 | Liu et al. | |
| 7,223,634 B2 | | 5/2007 | Yamaguchi | |
| 8,143,722 B2 | | 3/2012 | Curtis et al. | |
| 2003/0022477 A1 | * | 1/2003 | Hsieh et al. | 438/612 |
| 2003/0066681 A1 | | 4/2003 | Uchida et al. | |
| 2003/0222352 A1 | * | 12/2003 | Kung et al. | 257/772 |

(Continued)

FOREIGN PATENT DOCUMENTS

| | | |
|---|---|---|
| JP | 2005-51150 A | 2/2005 |
| JP | 2007-234841 A | 9/2007 |
| JP | 2008-135553 A | 6/2008 |
| TW | I243082 B | 11/2005 |
| TW | 200828548 A | 1/2008 |

OTHER PUBLICATIONS

Chinese Office Action received in Chinese App. No. 201010206061.5 (and English translation).

(Continued)

*Primary Examiner* — Olik Chaudhuri
*Assistant Examiner* — Quovaunda V Jefferson
(74) *Attorney, Agent, or Firm* — Miles & Stockbridge P.C.

(57) ABSTRACT

In order to achieve the highly reliable and highly functional semiconductor device capable of the high-speed transmission by stacking thin chips and substrates, a connecting process and a connecting structure capable of making a solid connection at a low temperature with a low load and maintaining the shape of a connecting portion even if the connecting portion is heated in the stacking process and the subsequent mounting process are provided. In a semiconductor device in which semiconductor chips or wiring boards on which semiconductor chips are mounted are stacked, a connecting structure between electrodes of the stacked semiconductor chips or wiring boards includes a pair of electrodes mainly made of Cu and a solder layer made of Sn—In based alloy sandwiched between the electrodes, and Sn—Cu—Ni intermetallic compounds are dispersed in the solder layer.

4 Claims, 9 Drawing Sheets

(56) References Cited

U.S. PATENT DOCUMENTS

2004/0177997 A1  9/2004  Hata et al.
2004/0188503 A1* 9/2004  Hua ............................. 228/254
2006/0049521 A1* 3/2006  Kayukawa et al. ........... 257/737
2007/0048172 A1  3/2007  Huang et al.

OTHER PUBLICATIONS

Taiwanese Office Action dated Dec. 21, 2012 issued in counterpart Taiwanese Patent Application No. 099116411 (and English Translation).

* cited by examiner

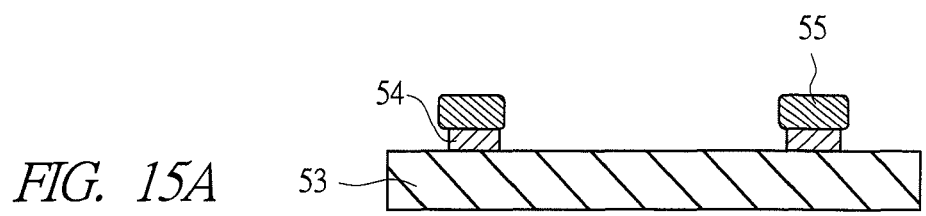
FIG. 15A
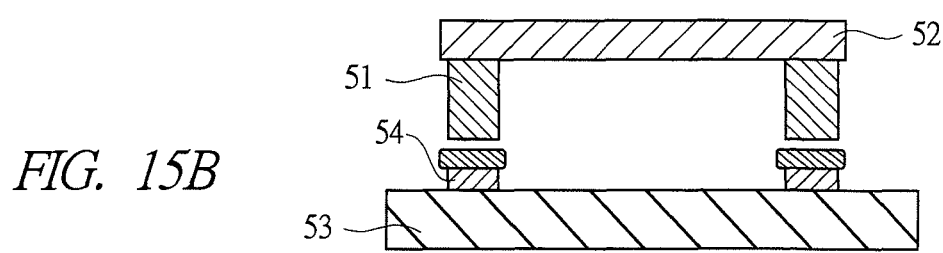
FIG. 15B
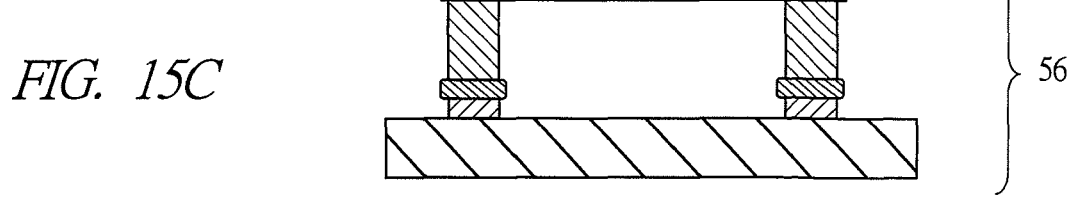
FIG. 15C
FIG. 16
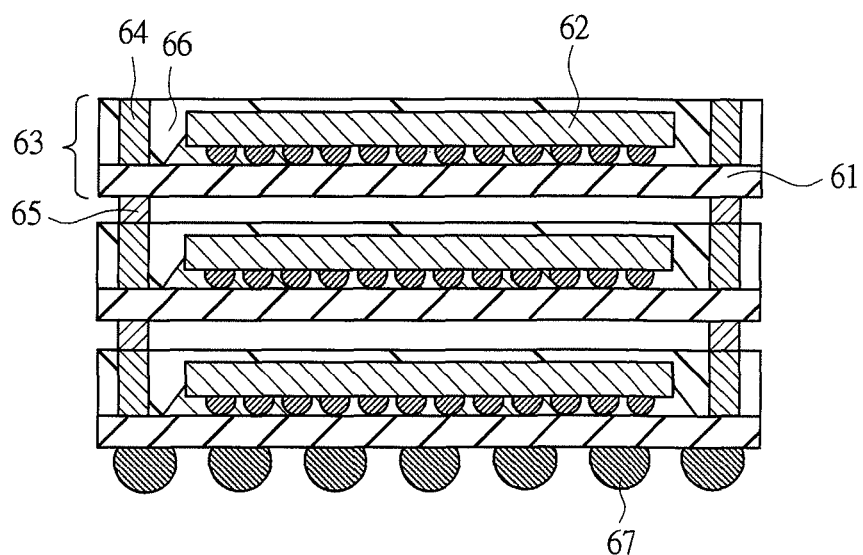

SEMICONDUCTOR DEVICE AND MANUFACTURING METHOD OF THE SAME

CROSS-REFERENCE TO RELATED APPLICATION

The present application claims priority from Japanese Patent Application No. 2009-167716 filed on Jul. 16, 2009, the content of which is hereby incorporated by reference into this application.

TECHNICAL FIELD OF THE INVENTION

The present invention relates to a manufacturing technology of a semiconductor device, and more particularly to a stacking method for electrically connecting upper and lower semiconductor chips and wiring boards by using through-silicon vias and a semiconductor device and an electric equipment using the stacking method. Further, it relates also to a technology effectively applied to a semiconductor device and an electronic component in which wiring boards on which semiconductor chips are mounted are stacked.

BACKGROUND OF THE INVENTION

In recent electronic devices such as a mobile phone and a digital camera, the functional enhancement and the reduction in size and weight of the electronic devices are important, and as the electronic components for their achievement, the highly functional, small-sized and thin electronic components have been required. Therefore, the density increase by the scaling-down of a large scale integrated circuit (LSI) of a semiconductor chip mounted in electronic components and the density increase by the system in package (SiP) technology as the package structure have been proceeding.

However, for the further scaling-down of the LSI, the LSI manufacturing line has to be modified, and an enormous amount of capital investment is required. Further, problems such as leakage current and others have become more obvious due to the scaling-down, and the deviation of the performance enhancement from the theoretical value also occurs in some cases.

In the SiP structure, a plurality of LSIs are mounted on an intermediate substrate called interposer substrate and sealed with resin, and chip electrodes and electrodes of the interposer substrate are connected by wire bonding using Au wires in many cases. The wire bonding is effective for the electrical connection because the lines of wires are flexibly changed. As a method of reducing the mounting area, the case where the chip mounted immediately above the interposer substrate is flip-chip bonded by Au bumps, solder bumps or ACF (Anisotropic conductive film) with an active element surface of the chip directed to the interposer substrate side has also been increasing.

Therefore, although the thickness of the chip and substrate has to be reduced and the pitch of the electrodes has to be narrowed for the further density increase and downsizing of the electronic component with the SiP structure, they have become difficult from the perspective of the manufacturing limit of the intermediate substrate mainly made of an organic substrate, the limit of thinning wires such as Au wires and the reliability of the wire bonding in a miniaturized region. Furthermore, in the electronic components for mobile devices, the demands for lower power consumption have been sharply increasing. Since each of the chips is connected through the intermediate substrate in the SiP structure, the SiP structure has the problem of large power consumption in addition to the long wiring length and the difficulty in high-speed transmission.

As described above, the measures by means of the density increase by the scaling-down of the LSI and the density increase by the SiP technology cannot sufficiently satisfy the increasing demands for the functional enhancement, the downsizing and the lower power consumption.

In such a circumstance, the three-dimensional LSI Package has attracted attention as one solution for the problem described above. In this three-dimensional LSI Package, upper and lower semiconductor chips and wiring boards are electrically connected by using through-silicon vias, and it is effective for the high-speed transmission and the reduction in power consumption because the wiring length can be reduced. Further, since the mounting area can be reduced, it is advantageous also for the downsizing. Therefore, various types of methods have been proposed for the stacking connection of the upper and lower chips and wiring boards (for example, Patent Documents 1 to 3).

Japanese Patent Application Laid-Open Publication No. 2005-51150 (Patent Document 1) describes a stack method of semiconductor chips. The chips are stacked in each chip mounting position of a semiconductor substrate in which a plurality of chip mounting regions are determined. Thereafter, the stacked chips are sealed with a sealing material. Then, the semiconductor substrate is cut at predetermined positions outside the chip mounting regions, thereby separating it into a plurality of semiconductor devices.

Japanese Patent Application Laid-Open Publication No. 2008-135553 (Patent Document 2) describes a substrate stacking method. It provides a substrate stacking method capable of facilitating the handling of the substrate by suppressing the warpage of the substrate when stacking the substrate. In this method, after connecting the substrates, the substrate is reduced in thickness by grinding the rear surface until the through electrodes are exposed.

Japanese Patent Application Laid-Open Publication No. 2007-234841 (Patent Document 3) describes a connection method at a low bonding temperature. In this method, the conductive layer is connected to the conductor made of indium via an intermediate layer containing copper-indium alloy, and the bonding temperature can be set lower than that of the case of using solder alloy bumps such as Sn-3.5Ag.

SUMMARY OF THE INVENTION

However, in the three-dimensional LSI Package as described above, as the chip and the substrate are reduced in thickness for the density increase, the warpage is likely to occur and the handling becomes more and more difficult. In addition, it is also difficult to accurately align and connect these warped members.

Also, when the temperature rises at the time of connection, the difference in the amount of warpage might be large due to the difference in material physicality between connecting members in some cases. Therefore, the temperature at the time of connection is desirably low. For example, when a material whose melting point is about 220° C. such as Sn—Ag based solder is used, the stress remains at the connecting portions due to the difference in the amount of shrinkage of the materials during the period when the connecting portions are bound at the temperature at which the material is solidified (melting point) and are cooled to the room temperature. So, with respect to the long-term reliability of the connecting portions, it is necessary to reduce the residual stress. Therefore, the connection at a low temperature is effective. In particular, in the connection between a substrate and a chip, since the difference in coefficient of thermal expansion between the substrate and the semiconductor chip is large, the residual stress at the connecting portions is increased. Therefore, if the connecting portions can be solidified at the glass transition point temperature of the substrate or lower, the residual stress can be significantly reduced.

Therefore, the connection method using metal such as indium described in the Patent Document 3 above has been proposed.

However, for providing the high-density semiconductor package by stacking the chips and substrates, the heating process is necessary every time when the chip and others are stacked and connected, and the connecting portions are heated and melt many times. Therefore, there is a possibility that the failure that the portion connected first is heated thereafter and is melt and detached occurs. Accordingly, it is necessary to take some measures in advance to prevent the occurrence of the problem even when the portion connected first is heated thereafter.

Also, particularly in the process of stacking and connecting the thin chips, the process has to be performed with a low load so that the chips are not damaged.

From the above, an object of the present invention is to provide a connecting process and a connecting structure capable of making a solid connection at a low temperature with a low load and maintaining the shape of the connecting portion even if the connecting portion is heated in the stacking process and the subsequent mounting process in order to achieve the highly reliable and highly functional semiconductor package (semiconductor device) capable of the high-speed transmission by stacking thin chips and substrates.

The above and other objects and novel characteristics of the present invention will be apparent from the description of the present specification and the accompanying drawings.

The typical ones of the inventions disclosed in the present application will be briefly described as follows.

(1) In a semiconductor device in which semiconductor chips or wiring boards on which semiconductor chips are mounted are stacked, a connecting structure between electrodes of the stacked semiconductor chips or wiring boards comprises: a pair of electrodes mainly made of Cu; and a solder layer made of Sn—In based alloy sandwiched between the electrodes, and Sn—Cu—Ni intermetallic compounds are dispersed in the solder layer.

(2) In a manufacturing method of a semiconductor device in which semiconductor chips or wiring boards on which semiconductor chips are mounted are stacked, the manufacturing method comprises the steps of: forming electrodes mainly made of Cu on surfaces of the semiconductor chips or wiring boards to be stacked; supplying, between the electrodes, solder made of Sn—In based alloy in which Ni particles are dispersed; and applying heat between the electrodes, thereby dispersing Sn—Cu—Ni intermetallic compounds in the solder.

(3) In a semiconductor device in which semiconductor chips or wiring boards on which semiconductor chips are mounted are stacked, a connecting structure between electrodes of the stacked semiconductor chips or wiring boards comprises: a pair of electrodes mainly made of Cu; and a solder layer made of Sn—In based alloy sandwiched between the electrodes, and Sn—Cu—Ni intermetallic compounds with two types of particle size are dispersed in the solder layer.

(4) In a manufacturing method of a semiconductor device in which semiconductor chips or wiring boards on which semiconductor chips are mounted are stacked, the manufacturing method comprises the steps of: forming electrodes mainly made of Cu on surfaces of the semiconductor chips or wiring boards to be stacked; supplying, between the electrodes, solder made of Sn—In based alloy in which Ni particles with two types of particle size are dispersed; and applying heat between the electrodes, thereby dispersing Sn—Cu—Ni intermetallic compounds in the solder.

(5) In a solder for use in the manufacture of a semiconductor device in which semiconductor chips or wiring boards on which semiconductor chips are mounted are stacked, solder powder and particle are contained, wherein the solder powder is made of one material selected from Sn—In, Sn—Bi and Sn—Bi—In or made of a material obtained by adding at least one or more of Ag, Ge, Cu, Al, Fe, Pt and P thereto, and Ni, Al, Fe, Ge, Ag or Pt is used for the particle and the single particles of these materials are contained or the plural materials thereof are contained in combination.

(6) In a stacked structure of semiconductor chips or wiring boards, for making the stacked structure sustain the reheating, a height of a connecting portion between electrodes is desirably 50 μm or less, and the height of the connecting portion is more desirably 30 μm or less. Also, in this connecting portion, the structure in which the precipitated compound is in contact with the compound layers formed at the interfaces between the connecting portion and the upper and lower electrodes is desirable.

The effects obtained by typical embodiments of the invention disclosed in the present application will be briefly described below.

Since the connection is made by the Sn—In based alloy and the melting point can be lowered to 120° C. when the Sn—In based alloy is Sn-52 mass % In, the connection can be made at a low temperature, and the problem due to the warpage can be reduced, so that the connection yield can be improved.

BRIEF DESCRIPTIONS OF THE DRAWINGS

FIG. 15A is a diagram showing the method of connecting a semiconductor chip having Cu posts to an organic substrate according to the fourth embodiment of the present invention;

FIG. 15B is a diagram showing the method of connecting a semiconductor chip having Cu posts to an organic substrate according to the fourth embodiment of the present invention;

FIG. 15C is a diagram showing the method of connecting a semiconductor chip having Cu posts to an organic substrate according to the fourth embodiment of the present invention; and FIG. 16 is a diagram showing the structure in which the semiconductor packages are stacked and connected in three stages as another connecting form using the connecting structure according to the first embodiment of the present invention.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

A first connecting structure according to the first embodiment of the present invention will be described with reference to FIG. 1. In the present embodiment, the connecting structure between the electrodes of stacked semiconductor chips or wiring boards will be described with using a semiconductor device in which semiconductor chips or wiring boards on which semiconductor chips are mounted are stacked as an example.

Figure 1:
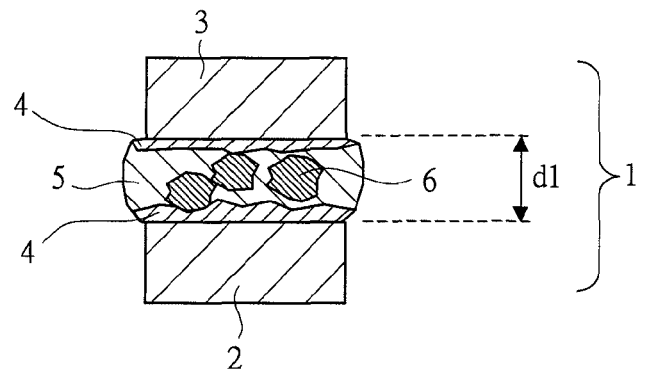
FIG. 1 is a diagram showing a first connecting structure according to the first embodiment of the present invention.

The first connecting structure 1 shown in FIG. 1 is made up of an electrode 2 of a lower stacked semiconductor chip or wiring board, an electrode 3 of an upper stacked semiconductor chip or wiring board, and a solder layer 5 sandwiched between the pair of electrodes 2 and 3. In the first connecting structure 1, Sn—Cu—Ni intermetallic compound 4 is precipitated at the interfaces of the pair of electrodes 2 and 3, and Sn—Cu—Ni intermetallic compound 6 is dispersed in the solder layer 5.

The electrodes 2 and 3 are made of Cu or a material mainly made of Cu. The distance between the electrode 2 and the electrode 3 at this time (height of connecting portion) d1 is 50 μm or less and is desirably 30 μm or less. The solder layer 5 is made of Sn—In based alloy solder. Also, the Sn—Cu—Ni intermetallic compound 6 formed in the solder layer 5 is desirably in contact with either one of the Sn—Cu—Ni intermetallic compounds 4 formed at the interfaces of the electrodes and more desirably in contact with both of the Sn—Cu—Ni intermetallic compounds 4 formed at the interfaces of the electrodes.

Figure 2:
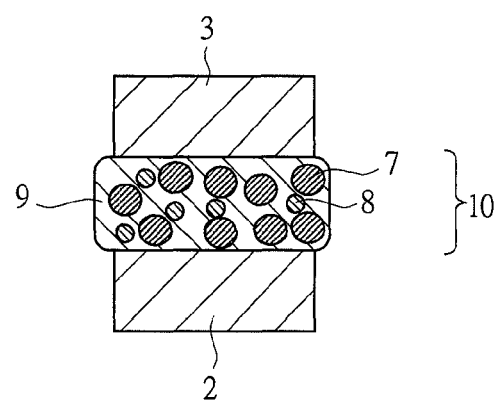
FIG. 2 is a diagram showing a structure in a previous stage for realizing the first connecting structure shown in FIG. 1.

FIG. 2 shows a structure in a previous stage for realizing the first connecting structure 1 shown in FIG. 1. FIG. 2 shows the state where the solder paste made of Sn—In based alloy in which Ni particles are dispersed, that is, solder paste 10 in which Sn—In solder powders 7, Ni particles 8 and an organic material 9 are mixed is supplied between the electrodes 2 and 3 made of Cu. By applying heat thereto, Sn is supplied from the Sn—In solder powders 7 and Ni is supplied from the Ni particles 8, and the Sn—Cu—Ni intermetallic compound 4 is precipitated at the interfaces of the electrodes 2 and 3 made of Cu as shown in FIG. 1. Further, in the solder paste 10, by the reaction between Cu from the electrodes 2 and 3 and Sn in the Sn—In solder powders 7 with the added Ni particles 8 serving as nucleuses, the Sn—Cu—Ni intermetallic compounds 6 are precipitated. In this manner, the structure shown in FIG. 2 is changed to that shown in FIG. 1.

The organic material 9 may contain an active flux component such as acid or organic acid in order to improve the wettability of the solder in addition to the organic solvent. The solder paste 10 containing these may contain a halogen component showing strong activity if it can be cleaned in the process after the connection. However, for supporting the no-clean process, it is important that the flux residue does not have the corrosive properties, and a low halogen or halogen free material is of importance. Further, in the case where the flux residue after the heating causes a problem, the organic material 9 in which the organic solvent is easily volatilized and solid contents are small is used. For the improvement of the strength after the connection, by using the organic material 9 containing a resin component hardened at the time of the heating, the connecting structure can be covered with the resin, and thus the connection strength can be improved.

The supplying method of the solder paste 10 to the electrodes 2 and 3 includes the dispenser supply, the printing method, the dipping method and others. When it is difficult to supply a small amount of solder for forming the thin solder layer 5, the amount of solder left after the heating can be controlled to some extent by increasing the ratio of the organic material 9 in the solder paste 10.

Figure 3:
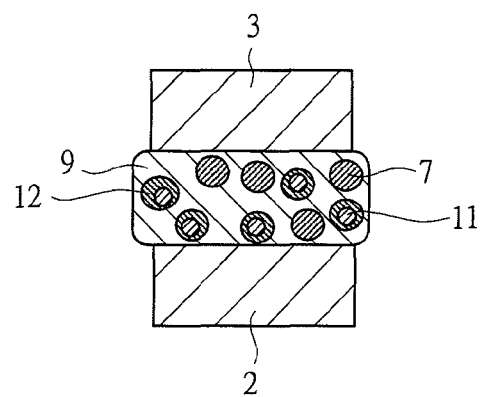
FIG. 3 is a diagram showing another structure in a previous stage for realizing the first connecting structure shown in FIG. 1.

FIG. 3 shows another structure in a previous stage for realizing the first connecting structure 1 shown in FIG. 1. In FIG. 3, solder particles obtained by covering Ni cores 11 with Sn—In layers 12 are contained in the solder paste 10. Other than those, the Sn—In solder powders 7 and the organic material 9 are contained, and by heating these, Cu is supplied from the electrodes 2 and 3 and the Sn—In layer 12 around the Ni core 11 is united into compound, so that the Sn—Cu—Ni intermetallic compound 6 is precipitated in the Sn—In based alloy solder layer 5 as shown in FIG. 1. As the advantage of the method shown in FIG. 3, the problem of the wettability of Ni which is originally not so good in wettability can be reduced because the Ni core 11 is covered in advance.

Further, in the cases shown in FIG. 2 and FIG. 3, the solder paste 10 is supplied between the electrodes 2 and 3 and heated at a time to form the connecting structure 1 of FIG. 1. As another method, after supplying the solder paste to one of the pair of electrodes 2 and 3 and then heating the solder paste, the other electrode is aligned on them and heated, thereby forming the connecting structure of FIG. 1. In this case, a problem occurs in the solderability in the bonding to the other electrode, but this problem can be solved by additionally supplying the flux component by such methods as spray coating, spin-coating and dispenser.

With respect to the size of the Sn—In solder powders 7 and the Ni particles 8, from the restriction on the thickness of the solder layer 5, the Sn—In solder powders are 30 µm or less and desirably 15 µm or less, and the Ni particles 8 are 20 µm or less.

Figure 4:
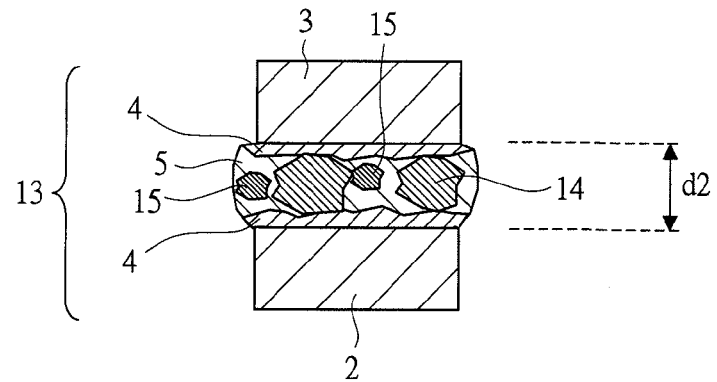
FIG. 4 is a diagram showing a second connecting structure according to the first embodiment of the present invention.

As another connecting structure according to the first embodiment of the present invention, FIG. 4 shows a second connecting structure 13 in which Sn—Cu—Ni intermetallic compounds with two types of particle size are formed. More specifically, in the second connecting structure 13, the Sn—Cu—Ni intermetallic compounds 4 are formed at the interfaces of the electrodes 2 and 3 made of Cu, and Sn—Cu—Ni intermetallic compounds 14 with a large particle size and Sn—Cu—Ni intermetallic compounds 15 with a small particle size are formed in the Sn—In based alloy solder layer 5.

Figure 5:
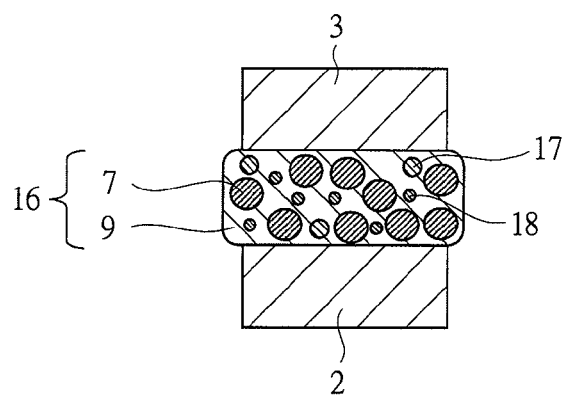
FIG. 5 is a diagram showing a structure in a previous stage for realizing the second connecting structure shown in FIG. 4.

FIG. 5 shows a structure in a previous stage for realizing the second connecting structure 13. FIG. 5 shows the state before the heating, in which solder paste 16 made of Sn—In based alloy in which Ni particles with two types of particle size are dispersed is supplied between the electrodes 2 and 3. Specifically, Ni particles 17 of 5 to 20 µm and Ni particles 18 of 0.1 to 5 µm are contained, and the Sn—In solder powders 7 and the organic material 9 are contained other than these. The Ni particles 17 with a large particle size are united with Cu and Sn and increased in volume to be the Sn—Cu—Ni intermetallic compounds 14 in FIG. 4, and they contribute to the stabilization of the connecting structure 13 even in the subsequent heating. On the other hand, the minute Ni particles 18 become the Sn—Cu—Ni intermetallic compounds 15 with a small particle size after the heating in FIG. 4, and they contribute to the improvement in reactivity because of their large surface area ratio. In addition, as another effect, the Sn—Cu—Ni intermetallic compound 14 formed from the Ni particle 17 with a large particle size is advantageous in that the height d2 of the connecting portion is stably determined when the bonding head is brought down in, for example, the thermocompression bonding process.

In the first connecting structure 1 and the second connecting structure 13 described above, solder powders of Sn—Bi or Sn—Bi—In and solder powders obtained by adding at least one material selected from Ag, Ge, Cu, Al, Fe, Pt and P thereto can be applied to the solder paste other than the Sn—In solder powders. Particles of Al, Fe, Ge, Ag or Pt can be applied instead of the Ni particles, and the single particles of these materials can be contained in the paste or the plural materials can be effectively contained in combination. However, it has no effect even when the above-described particle components are dissolved in the above-described solder powder components and then alloyed and powderized. Alternatively, it also has no effect even when some material is added in an organic to become metals after reaction instead. More specifically, it is important that metal particles are added to the solder paste to make a reaction with using the metal particles as nucleuses, thereby precipitating the Sn—Cu—Ni intermetallic compound in the connecting structure.

Figure 6:
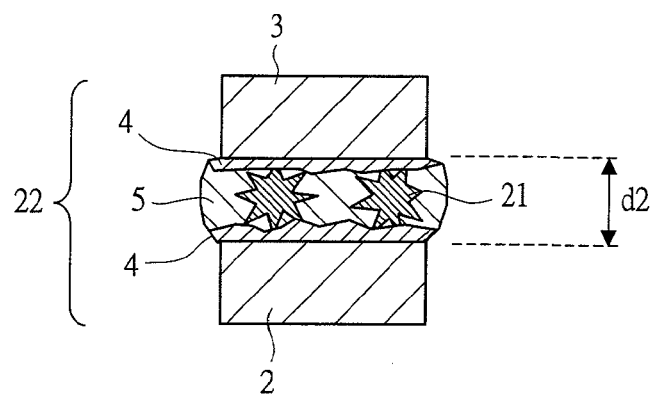
FIG. 6 is a diagram showing a third connecting structure according to the first embodiment of the present invention.
Figure 7:
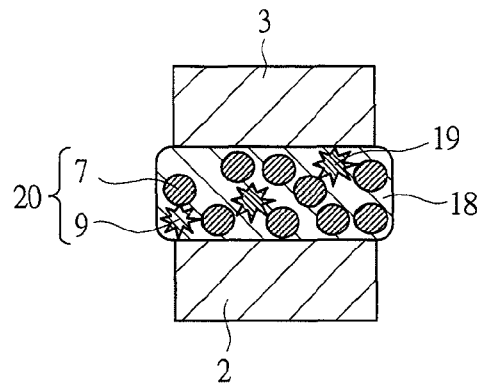
FIG. 7 is a diagram showing a structure in a previous stage for realizing the third connecting structure shown in FIG. 6.

FIG. 6 shows a third connecting structure 22 as another connecting structure according to the first embodiment of the present invention. FIG. 7 shows a structure in a previous stage for realizing the third connecting structure 22. In the third connecting structure 22, solder paste 20 to which Ni 19 with projections shown in FIG. 7 is added is used, and after the heating, the Sn—Cu—Ni intermetallic compounds 21 with projections are stuck to the Sn—Cu—Ni intermetallic compounds 4 formed at the interfaces of the electrodes 2 and 3 as shown in FIG. 6, so that the effect of preventing the movement of the solder layer 5 in the subsequent reheating can be increased.

Second Embodiment

The manufacturing method of a semiconductor device using the connecting structure according to the first embodiment will be described as the second embodiment of the present invention with reference to FIG. 8 to FIG. 12. As the specifications of this semiconductor device, the semiconductor chips are stacked in four stages on an intermediate substrate, and solder bumps are attached on the rear surface of the intermediate substrate for mounting it on a mother board.

Figure 8A:
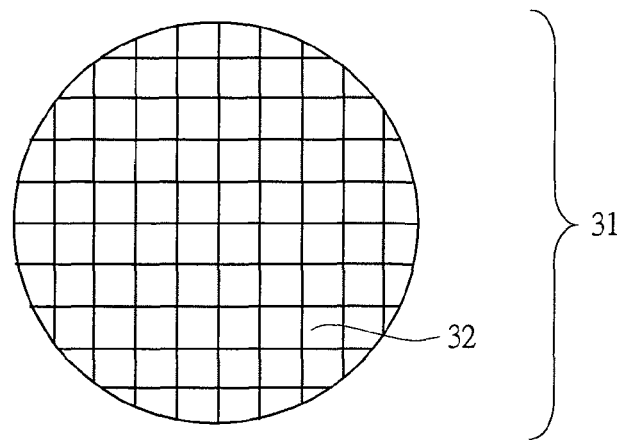
FIG. 8A is a diagram showing a Si wafer and an arrangement of semiconductor chips in the manufacturing method of a semiconductor device according to the second embodiment of the present invention.
Figure 8B:
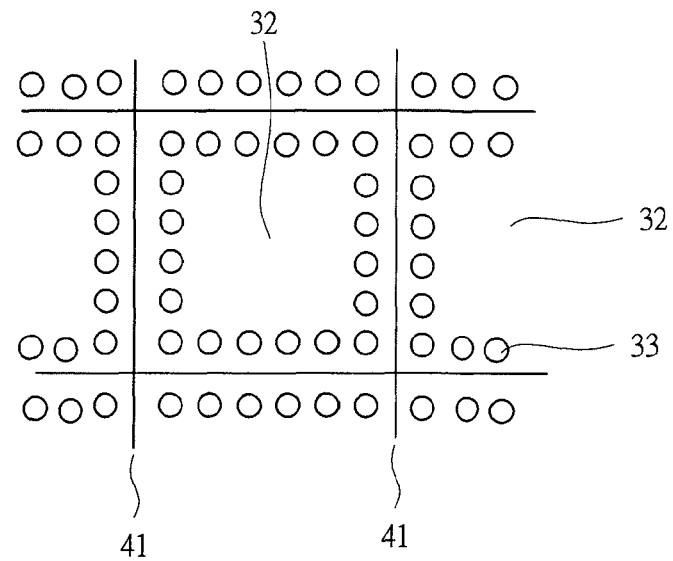
FIG. 8B is a diagram showing a Si wafer and an arrangement of semiconductor chips in the manufacturing method of a semiconductor device according to the second embodiment of the present invention.

FIG. 8A and FIG. 8B are diagrams showing a Si wafer and an arrangement of semiconductor chips. FIG. 9A to FIG. 9F are diagrams showing the forming method of the semiconductor chip using the Si wafer in FIG. 8A and FIG. 8B. FIG. 10A to FIG. 10E and FIG. 11 are diagrams showing the method of stacking and connecting the semiconductor chip shown in FIG. 9 and the structure of the semiconductor device. FIG. 12A to FIG. 12C are diagrams showing the detailed change of the connecting structure in the process of stacking and connecting the semiconductor chip shown in FIG. 9 to FIG. 11.

For the manufacture of the semiconductor device, an electric circuit is first formed on a Si wafer 31 as shown in FIG. 8A. This is the state before cutting the Si wafer 31 into respective semiconductor chips 32 (cut along boundary lines 41 of the semiconductor chips 32), and solder bumps 33 are provided to electrodes through Si disposed around the chip areas of the respective semiconductor chips 32 as shown in FIG. 8B.

Figure 9A:
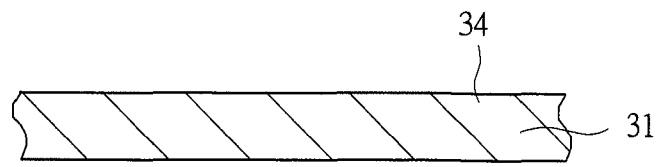
FIG. 9A is a diagram showing the forming method of a semiconductor chip using the Si wafer shown in FIG. 8A and FIG. 8B.
Figure 9B:
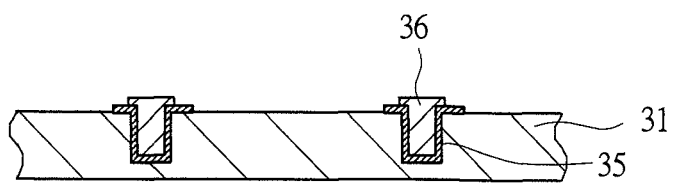
FIG. 9B is a diagram showing the forming method of a semiconductor chip using the Si wafer shown in FIG. 8A and FIG. 8B.
Figure 9C:
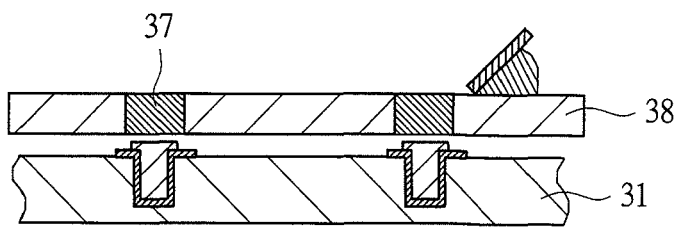
FIG. 9C is a diagram showing the forming method of a semiconductor chip using the Si wafer shown in FIG. 8A and FIG. 8B.
Figure 9D:
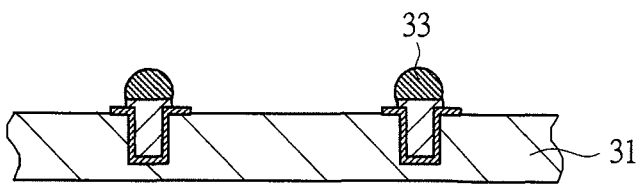
FIG. 9D is a diagram showing the forming method of a semiconductor chip using the Si wafer shown in FIG. 8A and FIG. 8B.
Figure 9E:
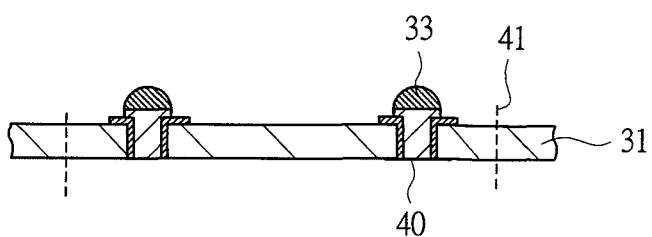
FIG. 9E is a diagram showing the forming method of a semiconductor chip using the Si wafer shown in FIG. 8A and FIG. 8B.
Figure 9F:
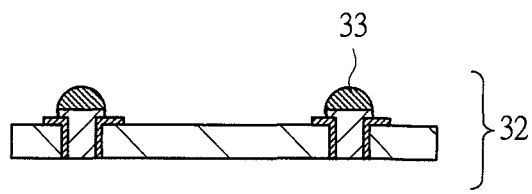
FIG. 9F is a diagram showing the forming method of a semiconductor chip using the Si wafer shown in FIG. 8A and FIG. 8B.

FIG. 9A to FIG. 9F show the forming method of the semiconductor chip 32 having the solder bumps 33. By using the Si wafer 31 having an active element surface 34 shown in FIG. 9A, concave portions 35 are formed in the active element surface 34 of the Si wafer 31 and a conductive member 36 is supplied to the concave portions 35 as shown in FIG. 9B. Thereafter, solder paste 37 obtained by mixing Sn—In solder powders, Ni particles and an organic material is supplied onto each through electrode by printing using a metal mask 38 and the solder paste is heated as shown in FIG. 9C, thereby forming the solder bumps 33 as shown in FIG. 9D. Then, by grinding the rear surface of the active element surface 34 of the Si wafer 31 of FIG. 8 on which the solder bumps 33 have been formed, the conductive members 36 in the concave portions 35 are exposed to the rear surface, thereby forming the electrodes 40 on the rear surface as shown in FIG. 9E. In this manner, the Si wafer 31 is penetrated between the upper and lower surfaces. Cu is used as the conductive member 36 filled in the concave portion 35. Next, the Si wafer 31 is cut along the boundary lines 41 of the respective semiconductor chips 32 by dicing, thereby obtaining the pieces of semiconductor chips 32 as shown in FIG. 9F.

Figure 10A:
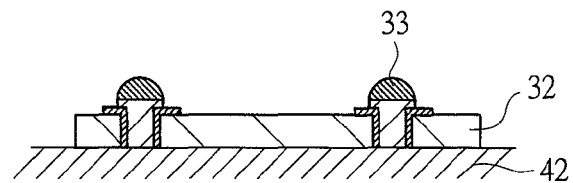
FIG. 10A is a diagram showing the method of stacking and connecting the semiconductor chip shown in FIG. 9F and the structure of the semiconductor device.
Figure 10B:
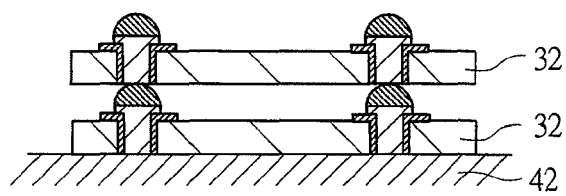
FIG. 10B is a diagram showing the method of stacking and connecting the semiconductor chip shown in FIG. 9F and the structure of the semiconductor device.
Figure 10C:
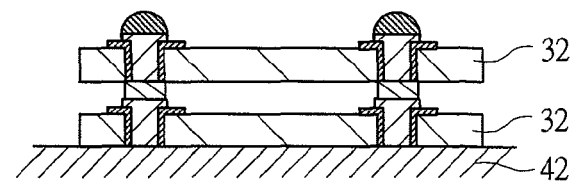
FIG. 10C is a diagram showing the method of stacking and connecting the semiconductor chip shown in FIG. 9F and the structure of the semiconductor device.
Figure 10D:
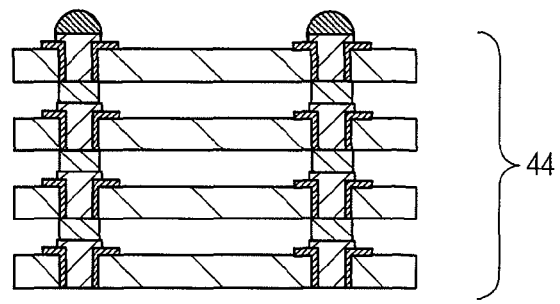
FIG. 10D is a diagram showing the method of stacking and connecting the semiconductor chip shown in FIG. 9F and the structure of the semiconductor device.
Figure 10E:
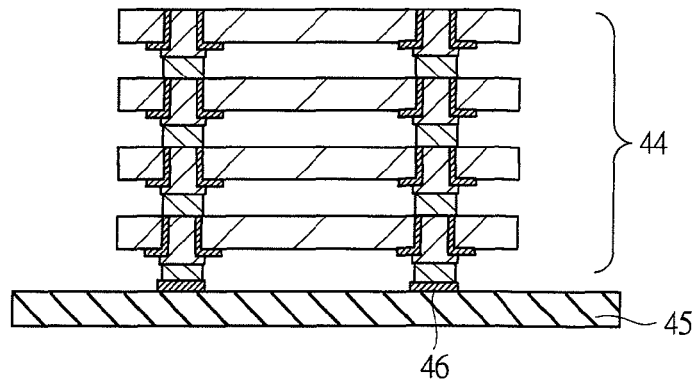
FIG. 10E is a diagram showing the method of stacking and connecting the semiconductor chip shown in FIG. 9F and the structure of the semiconductor device.
Figure 11:
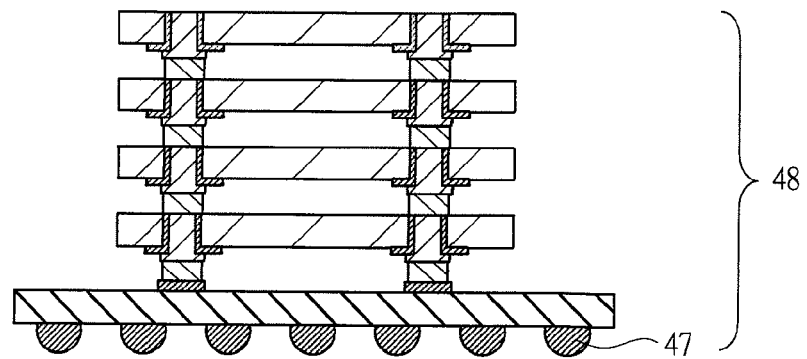
FIG. 11 is a diagram showing the method of stacking and connecting the semiconductor chip continued from FIG. 10E and the structure of the semiconductor device.
Figure 12A:
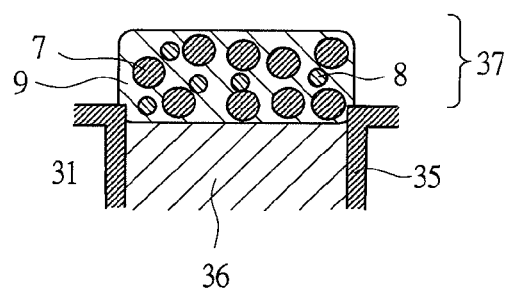
FIG. 12A is a diagram showing the detailed change of the connecting structure in the process of stacking and connecting the semiconductor chips shown in FIG. 9 to FIG. 11.
Figure 12B:
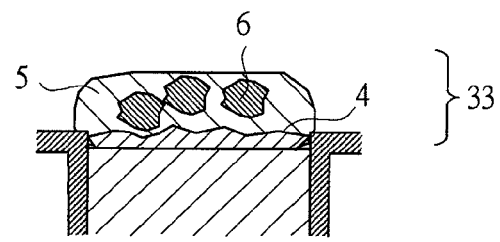
FIG. 12B is a diagram showing the detailed change of the connecting structure in the process of stacking and connecting the semiconductor chips shown in FIG. 9 to FIG. 11.
Figure 12C:
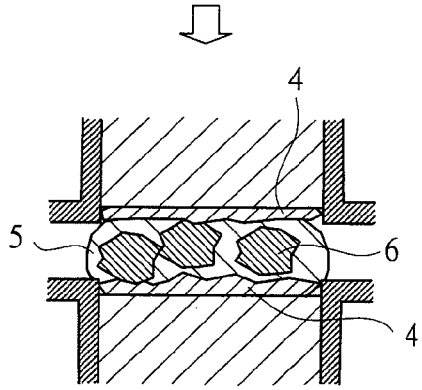
FIG. 12C is a diagram showing the detailed change of the connecting structure in the process of stacking and connecting the semiconductor chips shown in FIG. 9 to FIG. 11.

FIG. 10A to FIG. 10E and FIG. 11 show the process after the completion of the semiconductor chip 32. The semiconductor chip 32 on which the solder bumps 33 have been formed is placed on a stage 42 of the thermocompression bonding apparatus as shown in FIG. 10A, and the semiconductor chip 32 of the second stage is aligned and mounted, and then heated as shown in FIG. 10B, thereby stacking and connecting the upper and lower electrodes of the semiconductor chip 32 of the first stage and the semiconductor chip 32 of the second stage as shown in FIG. 10C. By repeating the process of stacking and connecting the through electrodes described above, the semiconductor chips of four stages are stacked (44) as shown in FIG. 10D, and the semiconductor chip 44 obtained by the stacking connection is inverted and aligned with electrodes 46 of an organic substrate 45 and then connected by heating as shown in FIG. 10E. Thereafter, solder balls 47 for the external terminals are attached on the rear surface of the organic substrate 45 and the organic substrate 45 are cut into respective pieces, thereby completing a semiconductor device 48 as shown in FIG. 11.

Here, FIG. 12A to FIG. 12C show the detailed change of the connecting structure in the process of stacking and connecting the semiconductor chips. In FIG. 12A to FIG. 12C, the first connecting structure described with reference to FIG. 1 and FIG. 2 in the first embodiment is taken as an example.

FIG. 12A shows the state where the solder paste 37 obtained by mixing the Sn—In solder powders 7, the Ni particles 8 and the organic material 9 is supplied by printing using the metal mask 38 on the through electrode formed of the conductive member 36 made of Cu supplied in the concave portion 35 formed in the Si wafer 31.

Next, FIG. 12B shows the state where the metal mask 38 is removed and the solder paste 37 is heated to the temperature higher than the melting point of the Sn—In solder powders 7 of 120° C., for example, 145° C. By this means, the Sn—Cu—In intermetallic compound 4 appears at the interface between the through electrode (conductive member 36) made of Cu and the Sn—In based alloy solder layer 5, and the Sn—Cu—In intermetallic compounds 6 grown with using the added Ni particles 8 as nucleuses are dispersed also in the solder layer 5. These are the components of the solder bump 33.

Next, for the semiconductor chip on which the solder bump 33 with the above-described structure has been formed, the through electrode made of Cu of another semiconductor chip is connected onto the solder bump 33 of the semiconductor chip. By this means, the structure in which the Sn—Cu—Ni intermetallic compounds 6 are dispersed in the Sn—In based alloy solder layer 5 is obtained as shown in FIG. 12C. Further, the Sn—Cu—Ni intermetallic compound 4 appears at the interface with the through electrode made of Cu.

The reason why the stacking connection can be realized when the connecting structure as described above is used will be described. First, since the melting point of the Sn—Cu—Ni intermetallic compounds 6 dispersed in the Sn—In based alloy solder layer 5 is high, the Sn—Cu—Ni intermetallic compounds 6 are not melted even in the subsequent reheating process. Furthermore, since the connection height of the solder layer 5 is reduced and the portion in which the ratio of the Sn—Cu—Ni intermetallic compounds 6 is high is locally formed in this connection height, the connecting portion is not broken even when the part of the solder layer 5 is remelted. Therefore, the stacking connection can be realized.

More effectively, however, the breaking can be more surely prevented by sealing the whole structure with resin and improving the strength by using an adhesive.

This structure can be realized through the thermocompression bonding process using bonding apparatus such as the flip-chip bonder. Since the distance between the parts to be connected can be shortened by applying pressure in the thermocompression bonding process, the parts to be connected can be pressed until the formed Sn—Cu—Ni intermetallic compounds reach the upper and lower surfaces of the electrodes, and the connecting portion more stable at the time of melting can be formed. Even in the apparatus in which pressure is not applied such as a reflow furnace, the connecting portion stable at the time of melting can be formed by optimizing the solder amount.

Through the process described above, the semiconductor device 48 in which the semiconductor chips 32 are stacked can be obtained. The characteristics of the semiconductor device 48 lie in that the bonding can be made at a low temperature and the stress left in the connecting portion can be reduced because the Sn—In based alloy solder layer 5 is used. In particular, since the glass transition point temperatures of organic substrates (FR4, FR5) are about 120° C. and 150° C., respectively, and the solder is solidified at the temperature equal to or lower than the glass transition point temperature, the residual stress is reduced compared with the case of Sn—Ag based alloy whose melting point is about 220° C. and Sn—Au based alloy whose melting point is about 280° C. Therefore, the yield of forming the connecting portion can be improved, and the structure excellent in long-term reliability can be realized.

Third Embodiment

Another manufacturing method of a semiconductor device using the connecting structure according to the first embodiment will be described as the third embodiment of the present invention with reference to FIG. 13A to FIG. 13E and FIG. 14A to FIG. 14C. In the second embodiment described above, the solder bumps are formed at once on the Si wafer and individual pieces of the semiconductor chips 32 obtained by the dicing are used and stacked with the active element surface 34 thereof directed upward, and the stacked semiconductor chips 32 are finally connected together to the organic substrate 45. However, the present invention is not limited to this method.

In the manufacturing method of a semiconductor device in the present embodiment, as the method of stacking and connecting the semiconductor chips and the structure of the semiconductor device, an example in which the semiconductor chips 32 are connected to the organic substrate 45 with the active element surface of the semiconductor chip 32 directed downward is shown in FIG. 13A to FIG. 13E and FIG. 14A to FIG. 14C.

Figure 13A:
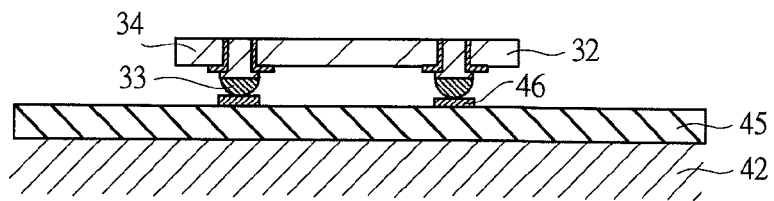
FIG. 13A is a diagram showing the method of stacking and connecting the semiconductor chips and the structure of the semiconductor device in the manufacturing method of a semiconductor device according to the third embodiment of the present invention.
Figure 13B:
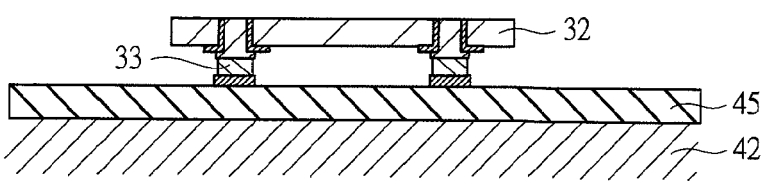
FIG. 13B is a diagram showing the method of stacking and connecting the semiconductor chips and the structure of the semiconductor device in the manufacturing method of a semiconductor device according to the third embodiment of the present invention.
Figure 13C:
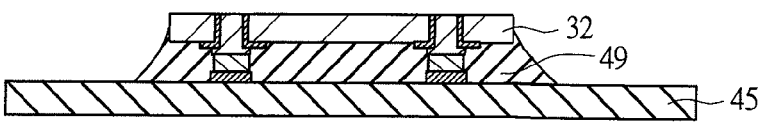
FIG. 13C is a diagram showing the method of stacking and connecting the semiconductor chips and the structure of the semiconductor device in the manufacturing method of a semiconductor device according to the third embodiment of the present invention.
Figure 13D:
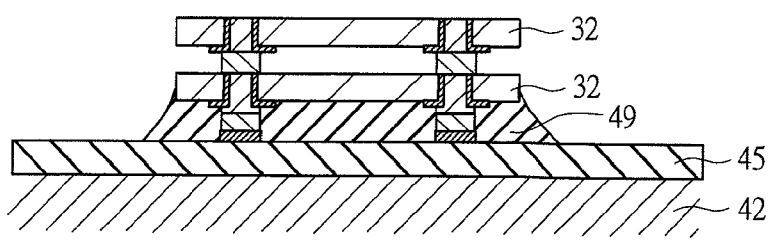
FIG. 13D is a diagram showing the method of stacking and connecting the semiconductor chips and the structure of the semiconductor device in the manufacturing method of a semiconductor device according to the third embodiment of the present invention.
Figure 13E:
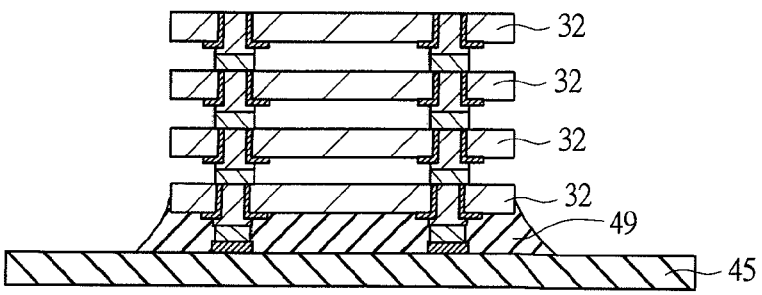
FIG. 13E is a diagram showing the method of stacking and connecting the semiconductor chips and the structure of the semiconductor device in the manufacturing method of a semiconductor device according to the third embodiment of the present invention.
Figure 14A:
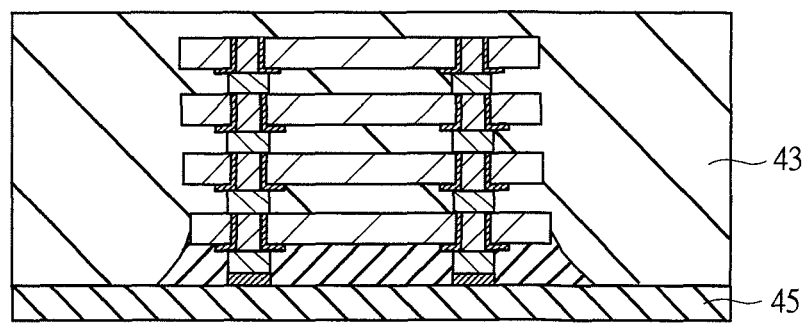
FIG. 14A is a diagram showing the method of stacking and connecting the semiconductor chips and the structure of the semiconductor device continued from FIG. 13E.
Figure 14B:
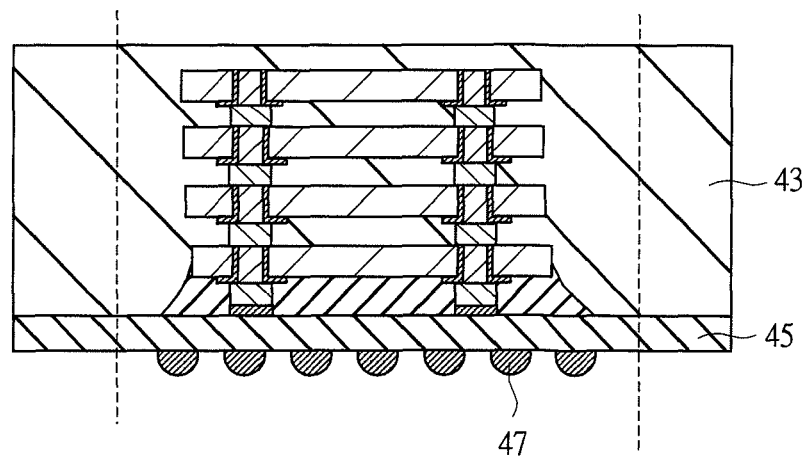
FIG. 14B is a diagram showing the method of stacking and connecting the semiconductor chips and the structure of the semiconductor device continued from FIG. 14A.
Figure 14C:
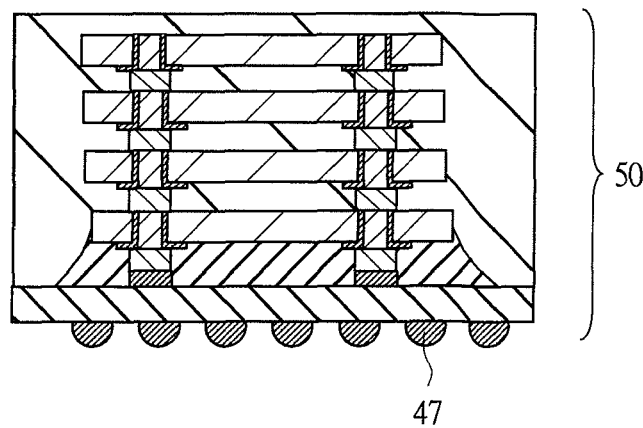
FIG. 14C is a diagram showing the method of stacking and connecting the semiconductor chips and the structure of the semiconductor device continued from FIG. 14B.

First, the active element surface 34 of the semiconductor chip 32 is directed to the organic substrate 45 side and is aligned with the electrodes 46 on the organic substrate 45 as shown in FIG. 13A, and then, the thermocompression bonding is performed. This organic substrate 45 does not correspond to one semiconductor chip, but is an organic substrate corresponding to a plurality of semiconductor chips and is finally cut into respective areas. Next, the semiconductor chip 32 is connected to the organic substrate 45 by heating as shown in FIG. 13B. Then, in order to improve the reliability of the connecting portion, underfill resin 49 is injected into the space between the semiconductor chip 32 and the organic substrate 45 and then hardened as shown in FIG. 13C. Next, the organic substrate 45 is returned again on the stage 42 of the thermocompression bonding apparatus, and the semiconductor chip 32 of the second stage is aligned and thermocompression-bonded as shown in FIG. 13D. By repeating the process above, the semiconductor chips 32 of four stages are stacked on the organic substrate 45 as shown in FIG. 13E. Next, after molding resin 43 is injected and sealed to the whole required region on the organic substrate 45 as shown in FIG. 14A, the solder balls 47 for external terminals are attached as shown in FIG. 14B, and the organic substrate 45 is cut into respective semiconductor devices 50 as shown in FIG. 14C.

Here, with respect to the underfill resin 49 for protecting the connecting portions, only the connecting portions of the semiconductor chip 32 connected to the organic substrate 45 are protected in the example shown in FIG. 13 and FIG. 14. This is because the stress is large in the semiconductor chip 32 of the first stage due to the difference in coefficient of thermal expansion between the organic substrate 45 and the semiconductor chip 32, but in the stages after the first stage, for example, in the second and third stages, the connection is made between Si and Si and the difference in coefficient of thermal expansion is small and the protection of the connecting portions is considered unnecessary. However, the underfill resin may be used for each of the connecting portions. Alternatively, the underfill resin may be sealed at a time in the vacuum atmosphere. At this time, it is also possible to use the pre-coat resin which is supplied by the dispenser or the like before the thermocompression bonding process and is hardened by performing the thermocompression bonding.

Fourth Embodiment

An example in which the connecting structure according to the first embodiment is used for another connecting form will be described as the fourth embodiment of the present invention with reference to FIG. 15A to FIG. 15C. FIG. 15A to FIG. 15C show the example of the method of connecting a semiconductor chip 52 having Cu posts 51 to an organic substrate 53.

First, solder paste 55 obtained by mixing Sn—Bi solder powders, Ni particles and an organic material is supplied to electrodes 54 made of Cu on the organic substrate 53 as shown in FIG. 15A. Then, the semiconductor chip 52 on which the Cu posts 51 have been formed is aligned and connected thereto by the thermocompression bonding as shown in FIG. 15B, so that an intended connecting structure body 56 shown in FIG. 15C is obtained. At this time, since the solder paste 55 containing the Sn—Bi solder powders is used, the connecting temperature is set to 170° C. and the good wettability can be ensured. Further, although the connecting structure body 56 is subjected to the subsequent processes of the wire bonding between other semiconductor chips and the organic substrate 53, the solder ball attachment for the external terminals on the rear surface of the organic substrate 53 and the mounting to the mother board, since the Sn—Cu—Ni intermetallic compounds created with using the Ni particles as nucleuses are precipitated in the solder connecting portion, a problem such as the peeling does not occur in the subsequent processes.

From the above, it can be understood that the stacking connection can be realized because heating can be performed at a low temperature and the stress can be reduced when the connecting structure according to the first embodiment is used.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, as another connecting form using the connecting structure according to the above-described first embodiment, the connecting structure can be applied to a connection between semiconductor chips such as the CoC connection and a connection between package structures such as the PoP connection, and it is effective for the reliability improvement.

Of these, an example of the stacking connection of the package structures is shown in FIG. 16. FIG. 16 shows the structure in which semiconductor packages 63 are stacked and connected in three stages. In each of the semiconductor packages 63, a semiconductor chip 62 is mounted on a substrate 61 and is sealed with molding resin 66. The semiconductor packages 63 are electrically connected by using the connecting structures 65 according to the above-described first embodiment via through hole electrodes 64 of the respective semiconductor packages 63. Further, solder balls 67 for external terminals are attached onto a rear surface of the lowermost semiconductor package 63. Also in this connecting form, the effect similar to those of the above-described embodiments can be obtained.

In the invention described in the embodiments of the present application, since the connection is made by the Sn—In based alloy and the melting point can be lowered to 120° C. when the Sn—In based alloy is Sn-52 mass % In, the connection can be made at a low temperature, and the problem due to the warpage can be reduced, so that the connection yield can be improved.

Furthermore, in the invention described in the embodiments of the present application, the temperature at which the solder in the connecting portion between the electrodes is solidified is lowered, and therefore, the residual stress of the connecting portion can be reduced, and the reliability of the connecting portion can be improved. In particular, since the glass transition point temperature of the organic substrate with high heat resistance is about 150° C. and that of the usual FR4 organic substrate is about 120° C., the solder can be solidified at the temperature equal to or lower than the glass transition point temperature, and thus, the residual stress can be significantly reduced.

Furthermore, in the invention described in the embodiments of the present application, Cu is used as a main electrode material and Ni particles are added to the solder in advance, and therefore, the Sn—Cu—Ni intermetallic compound is precipitated in the solder layer. Accordingly, even when the connecting portion is remelted in such subsequent heating processes as the stacking connection of other semiconductor chips, the solder bump attachment and the mounting to the mother board after the connection, the semiconductor chips can be stacked without the problem of the breakage of the connecting portion.

Furthermore, in the invention described in the embodiments of the present application, when the Ni particles with two or more types of particle size are added to the solder, the Ni particles with a minute particle size (up to 5 μm) show the effect of promoting the reaction, and the Ni particles with a large particle size (5 to 20 μm) can be used for the control of the height of the connecting portion by sandwiching the compound increased in volume by the reaction with the solder component and the electrode component between the electrodes. In addition, by the structure between the electrodes in which the compound is sandwiched, the breakage of the connecting portion can be prevented more reliably even when the connecting portion is remelted.

Furthermore, in the invention described in the embodiments of the present application, the connection is made by melting the solder material, and therefore, the connection with a low load is possible, and the invention can be applied also to the thin semiconductor chips.

Furthermore, as another effect of the invention described in the embodiments of the present application, although the Au solder process in which the melting point of the solder is increased at the time of connection by the use of the properties of Au which is noble metal easily soluble into Sn has been used in many cases in the conventional flip-chip bonding, since the generation rate of the Cu—Ni—Sn intermetallic compound is higher than the generation rate of Cu—Sn even if Au is not used, the Au-free connection without using Au is possible. It can be said that this is the process effective for the cost reduction.

The present invention relates to a manufacturing technology of a semiconductor device, and more particularly, it can be widely used for a semiconductor device in which semiconductor chips or wiring boards on which semiconductor chips are mounted are stacked, an electric equipment, an electronic component and others.

What is claimed is:

1. A manufacturing method of a semiconductor device, comprising the steps of:
    (a) providing a semiconductor chip including an electrode comprised of Cu, and a wiring substrate including an electrode comprised of Cu;
    (b) mounting the semiconductor chip over the wiring substrate via a solder in which solder powders and particles are mixed, the solder being supplied between the electrode of the semiconductor chip and the electrode of the wiring substrate, each of the solder powders being constituted by an alloy consisting essentially of Sn and In, and each of the particles being constituted by a non-alloy consisting essentially of Ni; and
    (c) heating the solder to thereby form a Sn—Cu—Ni compound in the solder, the Sn—Cu—Ni compound having one of the particles as a nucleus.

2. The manufacturing method according to claim 1, wherein the Sn—Cu—Ni compound is contacted with one of the electrode of the semiconductor chip and the electrode of the wiring substrate.

3. The manufacturing method according to claim 1, wherein the Sn—Cu—Ni compound is contacted with both the electrode of the semiconductor chip and the electrode of the wiring substrate.

4. The manufacturing method according to claim 1, wherein the wiring substrate has an upper surface and a lower surface opposite to the upper surface;
    wherein in step (b), the semiconductor chip is mounted over the upper surface of the wiring substrate;
    wherein plurality of solder balls are formed on a lower surface of the wiring substrate; and
    wherein the melting point of the Sn—Cu—Ni compound is higher than that of each of the solder balls.

* * * * *